(12) United States Patent
Gu et al.

(10) Patent No.: US 10,725,073 B2
(45) Date of Patent: Jul. 28, 2020

(54) INTERFEROMETRIC SENSOR

(71) Applicant: ABB Power Grids Switzerland AG, Baden (CH)

(72) Inventors: Xun Gu, Neuenhof (CH); Sergio Vincenzo Marchese, Zürich (CH); Klaus Bohnert, Oberrohrdorf (CH); Andreas Frank, Zürich (CH)

(73) Assignee: ABB Power Grids Switzerland AG, Baden (CH)

( * ) Notice: Subject to any disclaimer, the term of this patent is extended or adjusted under 35 U.S.C. 154(b) by 217 days.

(21) Appl. No.: 15/243,713

(22) Filed: Aug. 22, 2016

(65) Prior Publication Data

US 2016/0356823 A1 Dec. 8, 2016

Related U.S. Application Data

(63) Continuation of application No. PCT/EP2015/053513, filed on Feb. 19, 2015.

(30) Foreign Application Priority Data

Feb. 21, 2014 (EP) .................... 14156090

(51) Int. Cl.
*G01R 15/24* (2006.01)
*G01D 5/26* (2006.01)
*G01D 5/353* (2006.01)

(52) U.S. Cl.
CPC ........... *G01R 15/241* (2013.01); *G01D 5/266* (2013.01); *G01D 5/35306* (2013.01)

(58) Field of Classification Search
CPC ... G01R 15/241; G01D 5/266; G01D 5/35306
See application file for complete search history.

(56) References Cited

U.S. PATENT DOCUMENTS

| 4,596,466 A | 6/1986 | Ulrich |
| 4,904,931 A | 2/1990 | Miller |

(Continued)

FOREIGN PATENT DOCUMENTS

| CN | 102520374 A | 6/2012 |
| CN | 102914256 | 2/2013 |

(Continued)

OTHER PUBLICATIONS

European Patent Office, International Preliminary Report on Patentability issued in corresponding Application No. PCT/EP2015/053513, dated May 31, 2016, 15 pp.

(Continued)

*Primary Examiner* — Akm Zakaria
(74) *Attorney, Agent, or Firm* — Sage Patent Group

(57) ABSTRACT

An interferometric sensor and related methods are provided, with a sensing element whereby a measurand induces a relative phase shift between two waves, at least one detector measuring an interference signal between the two waves, and further including a phase shift detection unit having as input the interference signal and determining a first measure representative of the principal value of the relative phase shift, and a contrast detection unit having as input the interference signal for determining a second measure representative of the cross-correlation between the two waves, and a further a processing unit for converting the first and second measures to a measurand value.

20 Claims, 5 Drawing Sheets

(56) References Cited

U.S. PATENT DOCUMENTS

| | | | |
|---|---|---|---|
| 5,001,419 A | | 3/1991 | Miller |
| 5,271,034 A | * | 12/1993 | Abaunza ............... G01S 19/243 |
| | | | 342/357.62 |
| 5,301,010 A | | 4/1994 | Jones et al. |
| 5,715,058 A | | 2/1998 | Bohnert et al. |
| 6,429,939 B1 | | 8/2002 | Bennett et al. |
| 7,355,716 B2 | * | 4/2008 | de Boer ............... A61B 5/0059 |
| | | | 356/479 |
| 7,911,196 B2 | | 3/2011 | Bohnert |
| 2003/0117126 A1 | * | 6/2003 | Rahmatian ........... G01R 15/241 |
| | | | 324/96 |
| 2006/0158659 A1 | | 7/2006 | Colonna De Lega et al. |
| 2011/0169487 A1 | * | 7/2011 | Miki ................... G01R 33/0322 |
| | | | 324/244.1 |

FOREIGN PATENT DOCUMENTS

| | | |
|---|---|---|
| DE | 19701221 C1 | 4/1998 |
| EP | 1179735 A1 | 2/2002 |
| RU | 2032181 C1 | 3/1995 |
| WO | 9418523 A1 | 8/1994 |
| WO | 9805975 A1 | 2/1998 |
| WO | 2000036425 A2 | 6/2000 |
| WO | 2003093759 A3 | 11/2003 |
| WO | 2011069558 A1 | 6/2011 |

OTHER PUBLICATIONS

European Patent Office, International Search Report & Written Opinion issued in corresponding Application No. PCT/EP2015/053513, dated Apr. 20, 2014, 9 pp.

European Patent Office, Extended Search Report issued in corresponding Application No. 14156090.4, dated Sep. 9, 2014, 6 pp.

Al-Chalabi et al., "Partially Coherent Sources in Interferometric Sensors," Dept. of Electronic and Electrical Engineering, University College London, Torrington Place, London WC1E 7JE, pp. 132-135.

Beheim, "Fibre-Optic Thermometer Using Semiconductor-Etalon Sensor," Electronic Letters, Feb. 27, 1986, vol. 22, No. 5, pp. 238-239.

Beheim et al., "Fiber-linked interferometric pressure sensor," Rev. Sci. Instrum., vol. 58, No. 9, Sep. 1987, pp. 1655-1658.

Bohnert et al., "Fiber-Optic Current Sensor for Electrowinning of Metals," Journal of Lightwae Technology, vol. 25, No. 11, Nov. 2007, pp. 3602-3609.

Bohnert et al., "Temperature and Vibration Insensitive Fiber-Optic Current Sensor," Journal of Lightwave Technology, Vo. 20, No. 2, Feb. 2002, pp. 267-276.

Bosselmann et al., "High-Accuracy Position-Sensing with Fiber-Coupled White-Light Interferometers," Technische Universität Haburg-Harburg, D-21—Hamburg 90, Federal Republic of Germany, pp. 361-364.

Brooks et al., "Coherence Multiplexing of Fiber-Optic Interferometric Sensors," Journal of Lightwave Technology, vol. LT-3, No. 5, Oct. 1985, pp. 1062-1072.

Caber, "Interferometric profiler for rough surfaces," Applied Optics, vol. 32, No. 19, Jul. 1, 1993, pp. 3438-3441.

Farahi et al., "Coherence Multiplexing of Remote Fibre Optic Fabry-Perot Sensing System," Optics Communications, vol. 65, No. 5, Mar. 1, 1998, pp. 319-321.

Fercher et al., "Measurement of intraocular distances by backscattering spectral interferometry," Optics Communications, Vo. 117, 1995, pp. 43-48.

Huang et al., "Optical Coherence Tomography," Science, Vo. 254, Nov. 22, 1991, pp. 1178-1181.

Koch et al., "Displacement sensor with electronically scanned white-light interferometer," SPIE, Fiber Optic Sensors IV, vol. 1267, 1190, pp. 126-133.

Kurosawa et al., "Development of an Optical Instrument Transformer for DC Voltage Measurement," IEEE Transactions on Power Delivery, vol. 8, No. 4, Oct. 1993, pp. 1721-1726.

Lefevre, "The Fiber-Optic Gyroscope," Archtech House (1993), Chapters 2, 8 and 10, 32 pp.

Massey et al., "Electromagnetic field components their measurement using linear electrooptic and magnetoptic effects," Applied Optics, vol. 14, No. 11, Nov. 1975, pp. 2712-2719.

Takada et al., "New measurement system for fault location in optical waveguide devices based on an interferometric technique," Applied Optics, vol. 26, No. 9, May 1, 1967, pp. 1603-1606.

Youngquist et al., "Optical coherence-domain reflectometry: a new optical evaluation technique," Optics Letters, vol. 12, No. 3, Mar. 1987, pp. 158-160.

Zhang et al., "Quasi-reciprocal reflective optical voltage sensor based on Pockels effect with digital closed-loop detection technique," Optics Communications, Vo. 283, 2010, pp. 3878-3883.

Russian Patent Office, English Machine Translation of Russian Search Report & Written Opinion, dated Oct. 21, 2018, Moscow, Russian Federation, 2 pp.

Chinese Patent Office, English Machine Translation of Chinese Search Report & Written Opinion, dated Jul. 3, 2018, Beijing, China, 8 pp.

* cited by examiner

INTERFEROMETRIC SENSOR

FIELD OF THE INVENTION

The invention relates to an interferometric sensor, wherein a change in the parameter to be measured is related to a relative phase shift between two waves, such as an electro-optic voltage sensor, particularly for DC electrical voltages, or a fiber-optic current sensor (FOCS).

BACKGROUND OF THE INVENTION

Sensors which rely on the interference between two waves, typically two orthogonal polarization modes of a wave, are known and used in a wide range of technical fields. The detector signals of these sensors are related to the cosine of the relative phase shift $\phi$ between the two waves. Therefore, phase shifts of $\phi$ and $\pm\phi+2n\pi$ (n being an integer number, also referred herein as the period counter) produce the same interference output, and hence cannot be distinguished from one another. Consequently, the unambiguous measurement range of the relative phase shift is limited to a range of $[0, \pi]$.

For example, an electro-optic DC voltage sensor consisting of a bismuth germanate ($Bi_4Ge_3O_{12}$, or BGO) crystal with its [001] crystal axis oriented along the optical path of the waves (see also reference [1] for further details) has a corresponding $\pi$-voltage or an unambiguous measurement range of about 75 kV for light waves at 1310 nm.

Although the sign ambiguity (between $\phi$ and $-\phi$ can be removed by combining two polarimetric signals with a (static) relative phase offset (preferably $\pi/2$, called quadrature signals) as described for example in ref. [2], the periodwise ambiguity (between $\phi$ and $\phi+2n\pi$) is an inherent problem for all interferometric measurements.

For relative measurements of phase shifts, the measurement range can be extended by fringe counting, zero-counting or similar history-tracking techniques. In AC voltage measurements, one can thus extend the measurement range to many times the $\pi$-voltage by combining quadrature polarimetric signals and using zero-counting (see ref. [2-4]), facilitated by the fact that the AC voltage continuously oscillates about zero. However, for absolute measurements in which history information is either unavailable or unreliable, the periodwise ambiguity is a genuine problem and places a fundamental limit to the achievable measurement range. This is particularly the case for DC voltage or DC current measurements, due to the absence of an oscillating waveform and thus the lack of a zero reference. Furthermore, the latter makes it difficult to distinguish voltage or current drifts from other effects such as changing optical loss, stress-induced birefringence, etc. It has been attempted, see ref. [5], to address the drift problem by chopping the applied voltage, but such solutions are not readily adaptable to HV applications.

Electro-optic voltage sensors can also be built using the modulation phase detection (MPD) technique as described for example in [6]. It is generally implemented in a non-reciprocal phase modulation scheme and commonly used in fiber-optic gyroscopes and fiber-optic current sensors, see ref. [7, 8]. Reciprocal MPD sensors have excellent phase accuracy and DC stability. The co-owned Patent U.S. Pat. No. 7,911,196 (cited herein as reference [9]) describes a voltage sensor incorporating a voltage sensing element (or several such elements), a 45° Faraday rotator, and the MPD modulation and detection electronics. The periodwise ambiguity remains a limitation in this technique, and therefore the sensor as described is also only capable of measuring a DC electro-optic phase shift $\phi$ between $-\pi$ and $+\pi$. A similar system with a transverse-configuration voltage cell can be found in ref. [10].

There have been efforts to extend the unambiguous measurement range of interferometry beyond $2\pi$. Both patent applications WO9805975A1 [11] and EP1179735A1 [12] propose for example using two distinct optical wavelengths, particularly in an electric voltage or current measurement. Because the optical phase shift as induced by the measurand depends on the wavelength, the interferometric signals measured at the two wavelengths generally have different periodicities as a function of the measurand. Hence, the measured value pair consisting of detector readings at the two wavelengths does not have a simple periodic dependence on the measurand, and can therefore be used to unequivocally allocate the measurand value in a large range. Three or more wavelengths can also be used (see ref. [12]), providing further advantages of eliminating all remaining ambiguous points. The two-wavelength (or multi-wave-length) method, however, requires at least two sets of light sources and detectors at distinct wavelengths, which significantly add to the complexity and may reduce the reliability of the sensor system.

In another approach in interferometry, low-coherence light is used. Such radiation encompasses a relatively broad bandwidth (sometimes known as white light), as opposed to the monochromatic radiation emitted by coherent laser sources, which are used in conventional interferometers. Consequently, the coherence time of the low-coherence light, inversely proportional to the band-width, is relatively short, equal to only a small number of optical periods. Low-coherence light sources are widely used in many fiber sensors, especially those consisting of many disparate sections, components and interfaces, mainly to temporally localize interfering waves and eliminate spurious interference from undesired back-scattering and cross-coupling. The same idea is also explored in coherence-multiplexed sensor systems as described in [13], where multiple signals are combined and separated based on their non-overlapping coherence times.

The narrow coherence peak provides a natural absolute reference for interferometric measurements. One of the earliest attempts to employ this principle for a sensor application appeared in ref. [14], and the first fully developed position sensor was demonstrated in [15] and U.S. Pat. No. 4,596,466 [16]. A number of low-coherence interference sensors have been developed using the same principle, to measure physical quantities such as pressure [17], temperature [18, 19], etc. Typically in these systems, a remote sensing interferometer is optically connected to a local reference interferometer in series. The low-coherence light produces a packet of white-light interference fringes as the local interferometer is scanned (either mechanically or electronically as described for example in reference [20]), and the central fringe in the packet provides an absolute reference for the accurate reproduction and locking of the phase shift between the two interferometers, so that no "zero-forgetting" should occur after an interruption. The local interferometer is simultaneously interrogated to measure the transferred phase shift, e.g., with another monochromatic light by fringe counting. It should be noted that for all the techniques using low-coherence light sources as described above, the low-coherence light is used to unambiguously transfer the interference signal from one interferometer to another, and the phase measurement is carried out in the reference interferometer by conventional fringe-counting means.

A related optical ranging technique termed optical coherence-domain reflectometry is also known, see ref. [21, 22]. The technique scans a delay line and detects the white-light interference fringes in order to measure the arrival times of the reflected waves from various interfaces. It was commercialized in the early 1990s and has gained widespread use in the field. The same concept can be extended to surface profiling [23], and also to cross-sectional imaging in biological samples, in which case an entire field called optical coherence tomography (OCT) [24] has emerged, which has become a very powerful tool in biological diagnostics. These techniques use the reflected or scattered white-light interference fringes for sample characterization. For these techniques, the phase shift of the waves used is generally not a parameter of interest.

Instead of scanning the delay to obtain white-light interference fringes in what is known as the time-domain approach, one can alternatively vary the detection wavelength and measure the spectrum at a fixed non-zero delay, in a so-called frequency-domain approach. In this case, one measures a modulated spectrum containing many spectral fringes. The frequency-domain white-light interferometry contains basically the same information as the time-domain counterpart, and the data acquisition can be accomplished in a single shot by a spectrograph. It is widely used in optical coherence tomography research [25] but has also seen some sensor applications.

In Patent U.S. Pat. No. 5,301,010 [26], the dependence of the white-light interference fringe contrast on a physical quantity is explicitly used to measure that quantity. In this patent, a dual-interferometer setup is used and the reflector in one arm of the reference interferometer is oscillated back and forth to record a number of white-light interference fringes about a given position. The value of the interference contrast at the given path length is calculated using the relative intensities of the maxima and minima of these fringes, and the measurand is then inferred from the contrast value. A preferred embodiment with a stepped mirror is also included in this patent, producing two shifted white-light interference fringe packets with the measurement point located in between. In this patent, the interference contrast is calculated and deliberately used for the measurement of a physical quantity. However, no phase measurement is performed in this technique, and scanning through multiple interference fringes is required to measure the contrast.

WO 94/18523, WO 03/093759 and US 2006/0158659 describe interferometric setups that also rely on scanning the whole interference fringes of broadband light.

In the light of the above, it is seen as an object of the invention to provide an interferometric sensor with the parameter to be measured represented by a relative phase shift between two waves, which does not exhibit periodwise ambiguity. It is seen as a particular object of the invention to remove periodwise ambiguity for sensors measuring DC parameters which do not oscillate rapidly during the duration of a measurement.

SUMMARY OF THE INVENTION

Hence, according to a first aspect of the invention, an interferometric sensor is provided, with a sensing element whereby a measurand induces a relative phase shift between two waves, at least one detector measuring an interference signal between the two waves, and further including a phase shift detection unit having as input the interference signal and determining a first measure representative of the principal value of the relative phase shift ($\varphi$), and a contrast detection unit having as input the interference signal and determining a second measure representative of the cross-correlation (A) between the two waves, and further a processing unit for converting the first and second measures to a measurand value.

The term "wave" here is meant in the general physical sense of the word, including all types of oscillations traveling in space and time. The wave may have narrow or broad spectral content, may be long-lasting or be limited in duration, and may be generated by one source or be synthesized from multiple sources. The nature of the wave may be mechanical (acoustic), electro-magnetic (optical), or of any other type. In the following description, the invention is described using light waves as examples. The two interfering waves can then be for example two orthogonal linear or circular polarization modes of a light wave.

The two waves in interference can in principle be emitted from different but mutually (at least partially) coherent sources. If the two waves are copies of the same wave, then the cross-correlation function (also known as the degree of mutual coherence) is an autocorrelation function (also known as the degree of self-coherence) of the wave in question.

For voltage or electrical field measurements according to this invention, the sensing element can comprise an electro-optic crystal, a crystalline electro-optic fiber, a poled fiber, or a fiber or bulk optic material attached to a piezo-electric element. For force or strain measurements according to this invention, the sensing element can comprise an optical fiber or a bulk optic material. For optical magnetic field sensors or current sensors according to this invention, the sensing element can comprise optical fibers or waveguides, including specialty low birefringent fibers, flint glass fibers, or spun highly-birefringent fibers; bulk magneto-optic materials, such as yttrium iron garnet crystals or fused silica glass blocks; or optical fibers, waveguides, or bulk optical materials attached to a magneto-strictive element; or combinations thereof.

Because the cross-correlation value changes with the relative group delay between the two waves (which in turn is proportional to their relative phase shift), different phase shift periods would see a different cross-correlation value. Therefore using the detected second measure representative of the cross-correlation, the sensor can remove period ambiguity from the relative phase shift as measured. Preferably, the detected second measure value is mapped to a period counter n using a pre-determined function or map of parameters representing the cross-correlation function of the waves within the measurement range of the sensor, and, combined with the detected first measure representing the principal value of the relative phase shift, a corresponding unambiguous measurand value is determined.

The amplitude of the cross-correlation (or autocorrelation) function of the wave(s) manifests itself as the interference contrast or fringe visibility. Various methods can be used to obtain the first and second measures as described, such as the polarimetric method or the modulation phase detection method.

Because of the Fourier transform relationship between the cross-correlation (or autocorrelation) and the spectrum, the waves in interference should have a sufficiently broad spectrum to produce a rapidly varying cross-correlation (or autocorrelation) function in a range of the same width as the target measurement range. The spectrum may cover a continuous band, or may consist of multiple disconnected bands or disconnected spectral lines.

A static group delay bias component can be used to adjust the bias of the relative group delay, in order to shift the target measurement range to a section of the cross-correlation function that has a strong and monotonic dependence on the relative group delay. The group delay bias component is to be inserted in series with the sensing medium before the point of interference between the two waves.

Here the words "rapid", "strong" and the like as related to the variation of the cross-correlation specifically mean that the difference in the cross-correlation value between adjacent phase shift periods is large enough to be resolved by the second measure detection by the signal processing unit, i.e., $|A(\phi)-A(\phi\pm2\pi)|\gg\delta A$, where $\delta A$ is the uncertainty in the measurement of $A(\phi)$. The uncertainty $\delta A$ depends, among others, on the light source power and the signal averaging time.

Advantageously, the variation of the cross-correlation with the group delay or phase shift $\phi$ is considered to vary strongly if the relative amplitude of the interference signal varies over a group delay of $2\pi$ by at least 0.1%, i.e. $|A(\phi)-A(\phi\pm2\pi)|/A(\phi)\geq 0.001$, with A being "second measure", in particular the amplitude of the interference signal.

The sensor is particularly preferred as a sensor for DC signals and more particularly for DC voltage or electrical field measurement, especially for medium or high voltage applications.

A further aspect of the invention relates to a method determining a first measure representative of the principal value of the relative phase shift and determining a second measure representative of the cross-correlation between two waves, both measures derived from an interference signal of the two waves passing through a sensing element introducing the relative phase shift between the two waves by interaction with the measurand, and converting the first and second measures to a measurand value. The combined measurements of the cross-correlation measure and the principal value of the relative phase shift can be advantageously used to remove period ambiguity from the phase shift measurement and hence can largely increase the unambiguous measurement range of an interferometric sensor.

The above and other aspects of the present invention together with further advantageous embodiments and applications of the invention are described in further details in the following description and figures.

DETAILED DESCRIPTION

In the following, the example of an orthogonal-polarization interferometer is used to describe steps of signal handling or processing used in the present invention. It should be noted that the underlying principles of the example described apply to many different types of interferometric sensors otherwise suffering from period-wise ambiguity. Hence they can actually be applied to any types of interferometers (Michelson, Mach-Zehnder, Fabry-Perot, Sagnac, etc.), with only minor differences in implementation or interpretation.

Typically, in an interferometer the optical detector signal after the interference can be written as the sum of a base term, which is proportional to the output power of the light source, and a sinusoidal term which varies with the phase shift $\phi$ between the interfering waves as influenced by the measurand. In addition, the interference of non-monochromatic waves introduces a further modification $A\tau$ to the detector signal which is related to the temporal coherence of the waves. It can be mathematically expressed as the degree of mutual coherence or field cross-correlation function with the relative group delay $\tau$ as the argument. Hence the detector signal of a typical interference measurement can be represented in general terms as $$I(x)=I_0/2[1+A(\tau(x))\cos(\phi(x))] \quad [1],$$

with $I_0$ representing the total power emitted by the light source, $\phi$ being the phase shift at the center wavelength of the waves, and $A(\tau)$ being the interference contrast or fringe visibility, which is also commonly defined and measured as the difference of the adjacent fringe maximum and minimum divided by their sum. Mathematically, it can be proven that with a non-monochromatic radiation, the interference contrast A represents the amplitude of the degree of mutual coherence or the cross-correlation function of the two interfering waves. When the waves are copies of the same wave, A is the degree of self-coherence or the autocorrelation function of the wave in question. Therefore, the sensor signal I(x) depends on the phase shift $\phi$ and the cross-correlation function $A(\tau)$, both of which are functions of the measurand x.

Figure 1A:
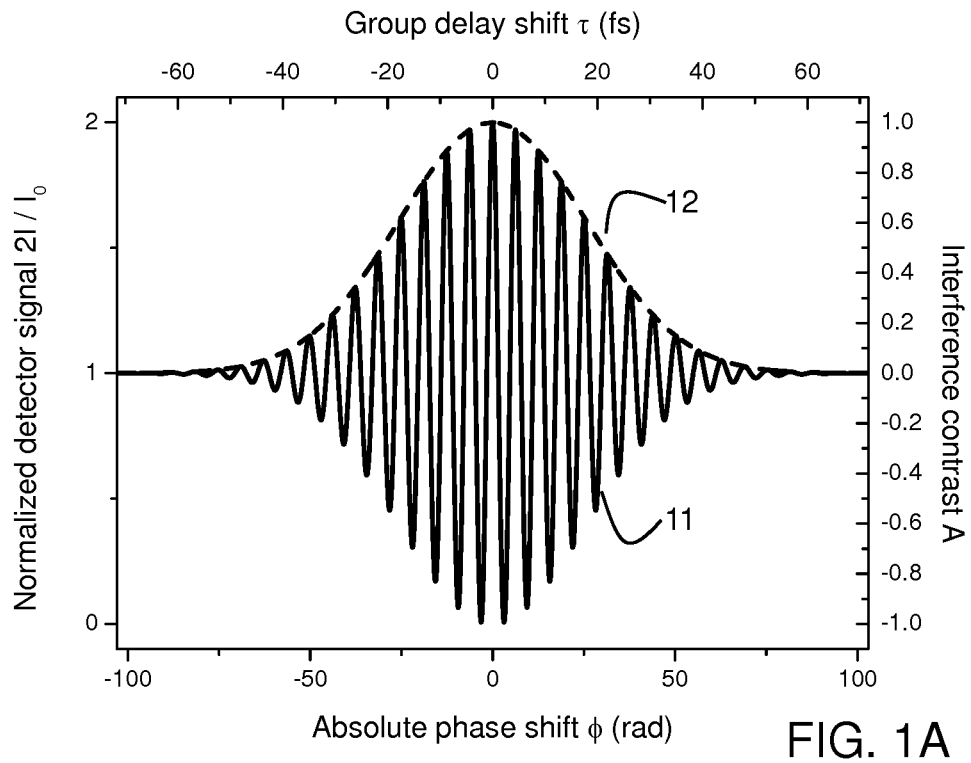
FIGS. 1A and 1B illustrate functions or mappings for use in an example of the invention.
Figure 1B:
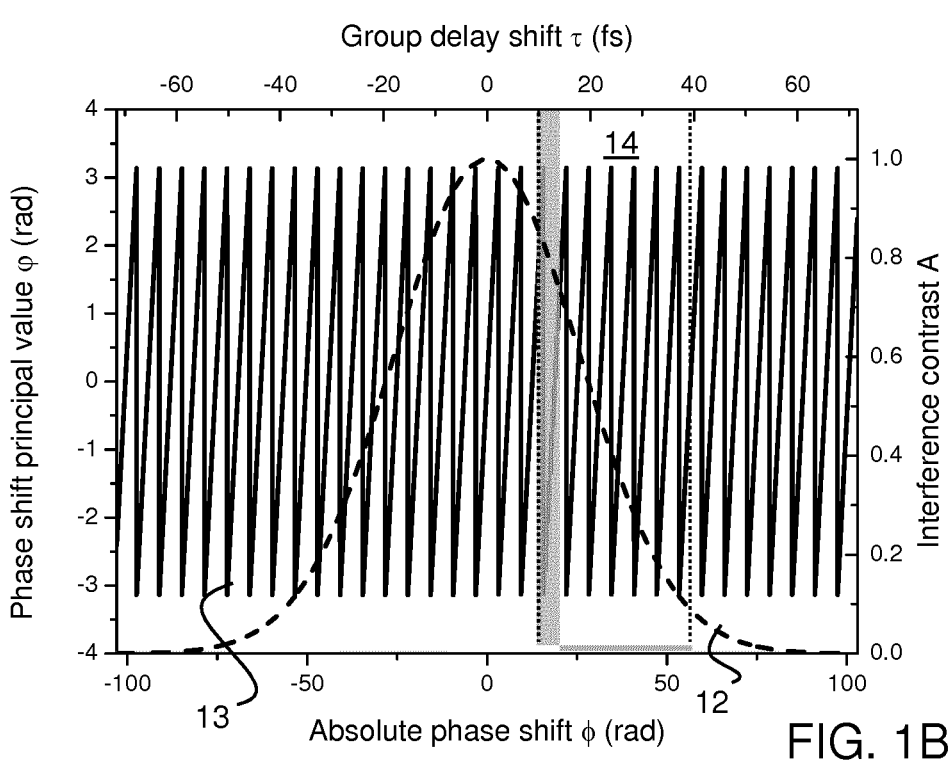

The typical behavior of a detector signal is shown in FIGS. 1A and 1B using the example of interfering two copies of a light wave with a Gaussian spectrum of 120 nm FWHM bandwidth centered at 1310 nm. For the sake of simplicity, the sensing medium is assumed to be nondispersive.

The normalized detector signal is shown as the oscillating line 11 as a function of the relative phase shift $\phi$, overlaid with the interference contrast A (auto-correlation function) as line 12 as a function of the relative group delay $\tau$ in femtoseconds (fs). The latter forms an envelope curve over the peaks of the detector signal 11. In FIG. 1B the oscillating line 13 is the principal value of the phase shift (phase shift mod $2\pi$ within the range $(-\pi, +\pi]$) and the line 12 is again the interference contrast A. The area 14 between the vertical dotted lines is a 7-fringe-wide range suitable for the unambiguous measurement of the relative phase shift $\phi$, with a strong monotonic dependence of the interference contrast A on the relative group delay τ.

The Wiener-Khinchin theorem states that the autocorrelation function is the inverse Fourier transform of the power spectrum. Therefore, a broadband radiation is also a low-coherence radiation, the autocorrelation function of which is a narrow function, with its value changing significantly from one phase period to another within its coherence time. The section of the autocorrelation function where it has a strong monotonic dependence on the relative group delay (e.g. the area 14 between the vertical dotted lines in FIG. 1B) is a suitable unambiguous measurement range, with its width determined by the spectrum and its offset controllable by a static group delay bias component. This static component can be a birefringent crystal or a birefringent fiber-optic component (such as a polarization-maintaining fiber) if the waves in interference are orthogonal linear polarized waves, or a Faraday rotator if the waves in interference are orthogonal circular polarized waves. The group delay bias component is to be inserted in series with the sensing medium before the point of interference of the two waves.

Therefore, provided the phase shift principal value φ (φ mod 2π within (-π, +π]) and the interference contrast are measured simultaneously, in a range where the cross-correlation function has a strong monotonic dependence on the relative group delay (for example, e.g. the area 14 between the vertical dotted lines in FIG. 1B), the interference contrast can be used to allocate the measured phase shift principal value to the correct period, and thereby unambiguously determine the full value of the relative phase shift. In other words, the interference contrast can be used in this range to unambiguously assign a period counter n to the principal value of the phase shift, as each period of the detected phase shift principal value 13 has a different interference contrast value within a monotonic part of line 12.

It is worth noting that the interference contrast measurement $A(\tau(x))$ alone already yields an unambiguous measurement of x (as is used in the cited patent U.S. Pat. No. 5,301,010, ref. [26]). However, the precision of the contrast measurement is generally not high enough to enable a sufficiently accurate measurement of the measurand x. Using the methods described in the present invention, the interference contrast $A(\tau(x))$ can be used to remove the periodwise ambiguity from a simultaneously measured phase shift principal value φ, which has a much higher sensitivity to x and is therefore more accurate.

One possible procedure is the following: From the measured phase shift principal value φ, a list of all possible full values of the relative phase shift $\phi_n = \varphi + 2n\pi$ within the measurement range is calculated and then converted into the corresponding measurand values $x_n$. Then, using a predetermined function or map of parameters representing the auto-correlation function $A(x)$, the corresponding contrast values $A_n = A(x_n)$ are determined and compared with the measured value of A. The n having the smallest deviation $|A_n - A|$ can then be selected to determine the full relative phase shift $\phi_n$ and thus the measurand value $x_n$.

It should be noted that the above procedure describes only an example and that there are other possible ways of signal processing, such as dividing the function A(x) (line 12) into value segments based on 2π periods, or converting the contrast measurement first to the corresponding full value of the phase shift rather than to the measurand x. The possible methods however have in common that the interference contrast (A) measurement is used to provide a coarse but unambiguous measurement of x, and combined with the ambiguous but highly accurate phase shift principal value (φ) measurement, an unambiguous and highly accurate measurement of x is obtained.

Any method that simultaneously measures the phase shift principal value φ and the interference contrast A can be used for the implementation of this invention. Next, two examples of such methods are presented.

Figure 2:
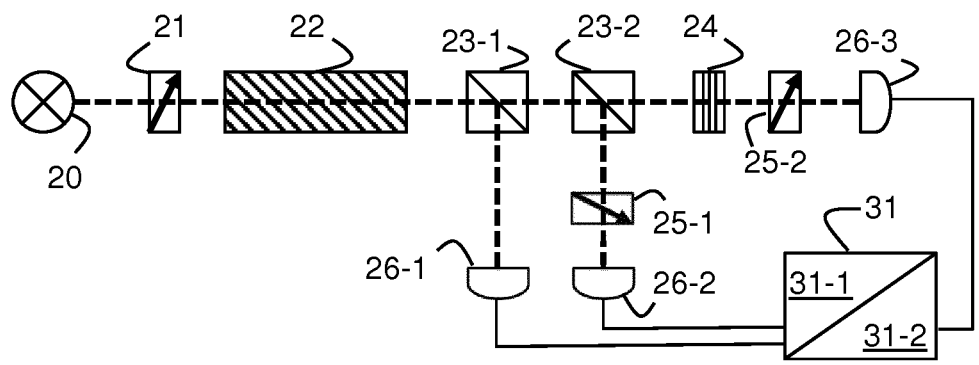
FIG. 2 illustrates a polarimetric quadrature signal detection scheme for use in an example of the invention.

The first example is based on the polarimetric method with FIG. 2 showing the schematic of a typical sensor using polarimetric quadrature detection, where a static optical phase shift bias is introduced between two detection channels. The components as shown are a light source 20, an input polarizer 21, a sensing element 22 (which in use would be exposed to the measurand), a first beamsplitter 23-1, a second beamsplitter 23-2, a quarter wave retarder (QWR) 24, a first output polarizer 25-1, a second output polarizer 25-2, and three optical power detectors 26-1, 26-2, 26-3. The beam path of the wave is shown as hashed line(s). Three detectors are connected to the output beam path: the first detector 26-1 with no polarizer attached, the second detector 26-2 with the linear output polarizer 25-1, and the third detector 26-3 with a quarterwave retarder 24 and the linear output polarizer 25-2. The optical signals measured at the three detectors are, up to some proportionality constants, respectively, $$I_1 = I_0$$

$$I_2 = I_0/2[1 + A(\tau)\cos(\phi)]$$

$$I_3 = I_0/2[1 + A(\tau)\sin(\phi)], \quad [2]$$

where $I_0$ represents the total power emitted by the light source 20, and φ is the relative phase shift at the beamsplitter 23-1.

In a first part (or phase shift detection unit) 31-1 of a signal processing unit 31 at least some of the measured signals are combined to derive a first measure representative of the principal value of the phase shift. In a second part 31-2 (or contrast detection unit) of the signal processing unit 31 at least some of the measured signals are combined to derive a second measure representative of the cross-correlation or autocorrelation function A. To such ends, a number of signal processing recipes exist. For example, the signal processing unit 31 can form a vector or complex variable Y in the following way $$Y = (2I_2/I_1 - 1) + i(2I_3/I_1 - 1) = A \exp(i\phi) \quad [3]$$

Using this definition, the phase shift principal value φ defined in (-π, π] is obtained as the argument or phase of Y, and the interference contrast A equals the absolute value of Y.

It can be further shown that the detection scheme as represented by FIG. 2 also works without an exact 90° phase bias (although preferred) and only requires having two polarimetric channels that have a certain known relative phase difference other than 0° or 180°. Indeed, if for example the third detector channel with the detector 26-3 has an additional phase offset δ, a complex variable can be calculated as $$Y = (1 - i\tan\delta)[(2I_2/I_1) - 1] + i(2I_3/I_1) - 1]/\cos\delta = Ae^{i\phi} \quad [3']$$

with the argument and absolute value of Y still yielding the phase shift principal value and the interference contrast. In this case, the QWR element 24 can be replaced by any phase retarder other than full and half-wave retarders.

Another option to measure $I_0$ could be having detectors measuring both antiphase outputs from a polarizing beamsplitter (replacing polarizer 25-1 or 25-2) in at least one of the two polarimetric detector channels as represented by detectors 26-2 and 26-3. The sum of the two antiphase outputs would then yield the total light power $I_0$. It should further be noted that the $I_0$ measurement is not required in cases where the total light power is known and/or kept constant, or can be readily monitored or controlled through electronic means or by using other detectors located before the optical sensing subsystem.

Figure 3:
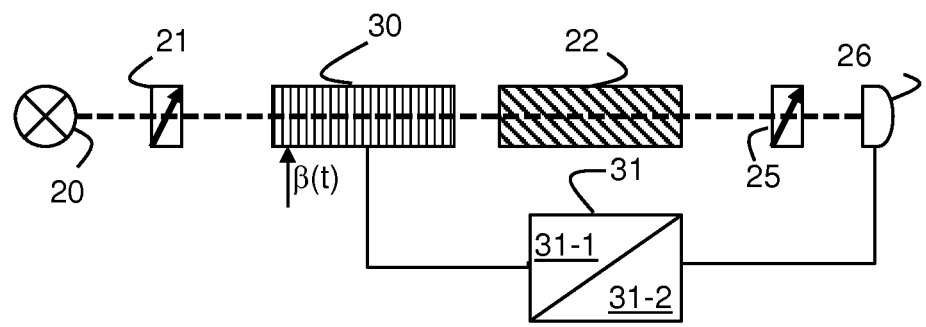
FIG. 3 illustrates a modulation phase detection scheme for use in an example of the invention.

As a second example of a method that measures the phase shift principal value and the interference contrast. simultaneously, FIG. 3 shows an example of the invention using an active phase modulation scheme. The sensor shown uses the modulation phase detection (MPD) principle, often implemented in a "non-reciprocal phase modulation" scheme and commonly used in fiber-optic gyroscopes and current sensors. The co-owned patent U.S. Pat. No. 7,911,196 cited as reference [9] above describes for example a voltage sensor incorporating a voltage sensing element (or several such elements), a 45° Faraday rotator, and the MPD modulation and detection electronics. It is important to note that the MPD technique has previously only been used to measure the phase shift principal value. But as shown in the following, the same measurement scheme can be extended to simultaneously yield the interference contrast.

The basic components for a sensor using the MPD detection scheme as shown in FIG. 3 (and using where appropiate the same numerals as in FIG. 2 for components with the same or similar function) are a light source 20, an input polarizer 21, a sensing element 22 (which in use would be exposed to the measurand), an output polarizer 25, and a detector 26. The beam path of the wave is shown as dashed line(s). A birefringent phase modulator 30 is also included in the beam path. The phase modulator 30 and the detector 26 are coupled through a signal processing unit 31 for performing the signal analysis as described in the following.

The birefringent phase modulator 30 is optically connected in series with the sensing medium 22, so that an additional optic phase shift modulation β(t) can be added to the phase shift to be measured. The detector 26 measures the modulated optical power after the linear polarizer 25. The modulated detector signal can be written as $$I(t)=I_0/2[1+A(\tau)\cos(\phi+\beta(t))]. \quad [4]$$

with $I_0$ representing the total power of the source, φ being the relative phase shift at the center wavelength without the additional modulation, and A(τ) being the interference contrast.

As in the example of FIG. 2 above, the first part (or phase shift detection unit) 31-1 of the signal processing unit 31 analyzes the detected signal I(t) to derive a first measure representative of the phase shift principal value φ of the relative phase shift φ; the second part (or contrast detection unit) 31-2 of the signal processing unit 31 analyzes the detected signal I(t) to derive a second measure representative of the cross-correlation or auto-correlation function A. Again, diverse signal modulation and processing schemes exist. In one version of the MPD scheme, a sinusoidal modulation β(t)=βsin(Ωt) is imposed by the phase modulator 30. The detector signal of eq. [4] can be written in a Fourier expansion as a series of harmonics at different orders k of the modulation frequency Ω, i.e., $$I(t)=\Sigma[B_k\cos(k\Omega t+\xi_k)] \quad [4']$$

with the first three harmonic amplitudes $B_k$ and phases $\xi_k$ being $$B_0=(I_0/2)[1+A(\tau)J_0(\beta)\cos(\phi)], \xi_0=0$$

$$B_1=I_0*A(\tau)J_1(\beta)\sin(\phi), \xi_1=\pi/2$$

$$B_2=I_0*A(\tau)J_2(\beta)\cos(\phi), \xi_2=0$$

using Bessel functions of the first kind $J_k(\beta)$. The signs of the harmonic components can be ascertained by comparing the phases of the harmonic components with that of the excitation waveform.

A vector or complex number can be formed from the above representation which allows to derive the phase shift principal value φ and the interference contrast A from the detected harmonic amplitudes $B_k$.

$$Y=B_2/J_2(\beta)+i\ B_1/J_1(\beta)=I_0A(\tau)\exp(i\phi) \quad [5]$$

As in the example of FIG. 2 above, the phase shift principal value φ can be calculated as the argument of Y, and the interference contrast A equals its absolute value divided by $I_0$. The total power $I_0$ can be calculated as $I_0=2B_0-J_0(\beta)$ abs(Y) cos (arg(Y)).

A preferred modulation amplitude is β=1.84 rad where $J_1(\beta)$ has its first maximum; another preferred amplitude is β=2.63 rad where $J_1(\beta)$ and $J_2(\beta)$ are equal. However, in principle for the MPD method to work, the phase modulation amplitude β can be arbitrarily small. Furthermore, it is known that the modulation amplitude β can also be calculated from the measured harmonic amplitudes, e.g., for the purpose of stabilizing the amplitude. Instead of a sinusoidal modulation, other waveforms, in particular a square wave modulation, may be used. Further details of open-loop MPD signal processing can be found in the references [6, 27].

Figure 4:
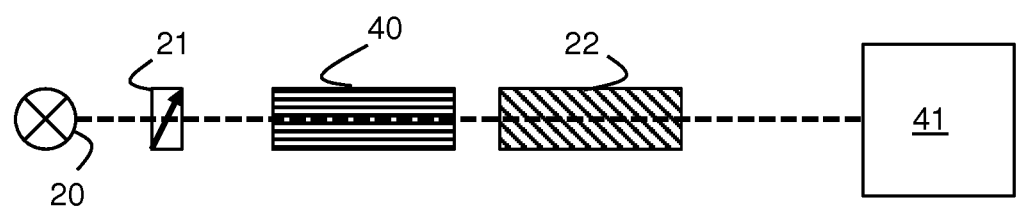
FIG. 4 illustrates the introduction of a group delay bias element into a sensor in accordance with an example of the invention.

As is explained earlier, a suitable unambiguous measurement range is within a region where the cross-correlation function A(T) is monotonous and the slope $|dA(\tau)/d\tau|$ is preferably as large as possible (i.e. around the steepest point). In FIG. 1B, this region is shown as the area 14 between two vertical dotted lines. And to ensure that the target measurement range of the sensor falls into this region, it is possible to add a pre-determined group delay offset by inserting a (static) group delay bias element 40 into the optical path in series with the sensing element 22, as shown in FIG. 4. It should be noted that the group delay bias element 40 can be inserted at any point between the input polarizer 21 and the point where the waves interfere.

The detection scheme as represented in FIG. 4 by a general detection unit 41 can be a polarimetric scheme or an MPD scheme as described above, or any other detection scheme that simultaneously detects the phase shift principal value and the interference contrast. As already described in connection with FIG. 1B, the group delay bias of the static element 40 and the coherence time of the light source 20 should be selected such that the target measurement range of the measurand x maps to a group delay range τ(x) that is contained within a monotonic portion of the A(τ) function with a large slope $|dA(\tau)/d\tau|$. After the sensor component selection or assembly, the interference contrast function A(x)=A(τ(x)) can be calculated or calibrated for the particular sensor, and may be saved in a tabulated or functional form for the one-to-one conversion between A and the period counter n or the measurand x.

As mentioned above, the removal of periodwise ambiguity as described can be applied to many types of interferometric sensors. Due to the lack of comparable alternatives, however, it is particularly suited to extending the measurement range of DC electric field or voltage sensors as described for example in reference [1].

In these sensors, a low-coherence light source (e.g., SLED source, 1310 nm center wavelength, 40 nm FWHM bandwidth) is used to produce interference signals, the auto-correlation of which changes significantly from one phase period to another. An electro-optic crystal is used as the sensing medium to convert the voltage to be measured to a relative phase shift between the orthogonal polarization modes in the crystal. An electro-optic crystal without natural birefringence (such as Bi4Ge3O12, BGO) is preferred. An electro-optic waveguide or fiber can also be used as the voltage sensing medium. The end faces of the BGO crystal (cut perpendicular to the [001] direction) are electrically connected to the electrodes that provide the voltage drop.

Hence, in comparison to some sensor designs found in prior art, the full voltage (not a fraction thereof) is applied across the sensing crystal. The voltage is applied in the longitudinal direction of the crystal, thus the path integral of the electric field in this direction (i.e. the applied voltage) is measured. Therefore, the voltage measurement is independent of the internal charge redistribution in the crystal.

Figure 5:
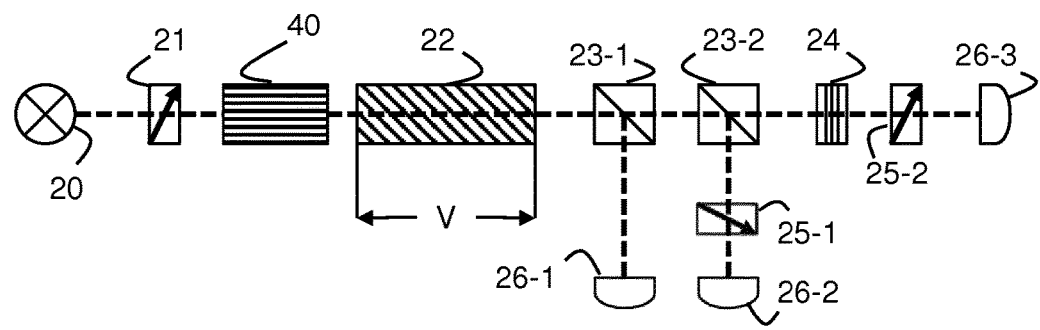
FIG. 5 is a DC voltage sensor based on a polarimetric quadrature signal detection scheme in accordance with an example of the invention.

In an example of a polarimetric detector for voltage, elements of FIG. 2 and FIG. 4 are combined (and hence the same numerals are used where appropriate) as illustrated in FIG. 5.

FIG. 5 shows a design of an extended-range DC voltage sensor where the sensing element is used in transmission. Three detector channels 26-1, 26-2 and 26-3 yield the total light power and two quadrature polarimetric signals, respectively, as described above (see eq. [2]). A birefringent crystal with static relative group delay (such as a crystalline quartz waveplate) is inserted between the input polarizer 21 and the second beamsplitter 23-2 as a group delay bias element 40, as discussed above. The use of a group delay bias element 40 is preferred, but may not always be needed if the polarity of the voltage to be measured is known and hence the sign of the slope of curve 12 in FIG. 1A and 1B in the measurement range is known. If the voltage polarity is unknown, the birefringent crystal 40 serves to extend the unambiguous measurement range over both polarities. The birefringent crystal may also be omitted if an electro-optic crystal with natural birefringence is employed as sensing element 22 that generates the desired group delay bias. To reduce the temperature dependence of the group delay bias, the group delay bias element 40 may be a composite optic made from two crystals in series, either with parallel optical axes, if their thermo-birefringence coefficients are of opposite signs, or with swapped optical axes, if their thermo-birefringence coefficients are of the same sign. Additionally, the temperature of the group delay bias element can be measured, whereby its temperature-dependent group delay and phase shift change can be compensated in signal processing.

The axes of the input polarizer 21 and the two output polarizers 25-1 and 25-2 are aligned at ±45°, whereas the axes of the group delay bias element 40 and the QWR 24 are aligned parallel to the electro-optic axes of the sensing element 22. The measurand x is in this example the voltage V applied between the end faces of the BGO crystal with the [001] crystal axis oriented in direction of the light wave propagation. Preferably, the beamsplitters should be aligned with their axes at 45° relative to the electro-optic crystal axes, in order to equalize any possible phase shift the two polarization waves may experience from the beamsplitter. Any residual system phase shifts, for example from the beamsplitter or from the residual natural birefringence of the electro-optic crystal, can be characterized and taken out by calibration. The residual birefringence of BGO, if any, can also be reduced by combining two BGO crystals in series, with antiparallel [001] axes and the x/y axes rotated 90° against each other. In this arrangement, the electro-optic phase shifts add up, while the intrinsic birefringence cancel, leading to a better zero-point stability.

Figure 6:
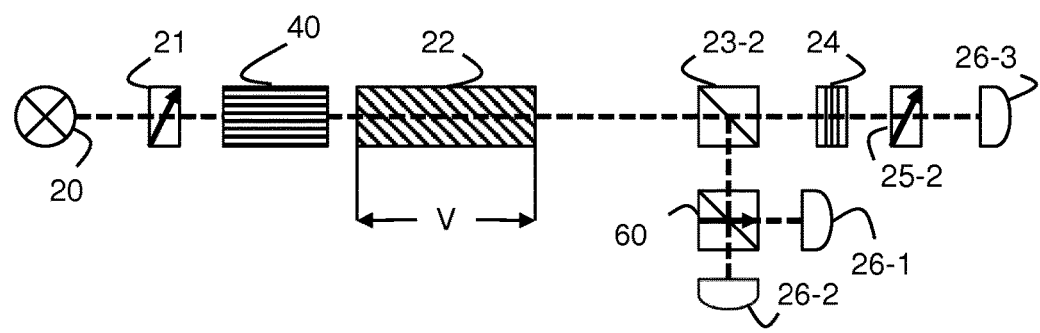
FIG. 6 is a DC voltage sensor based on a polarimetric quadrature signal detection scheme in accordance with an another example of the invention.

In FIG. 6, an apparatus similar to FIG. 5 is described where use is made of a different manner of measuring the total power as already described above in convection with eq. [2]. Only one birefringence-free beamsplitter 23-2 is used, and two detector channels with the detectors 26-1 and 26-2 are connected to the two antiphase outputs of polarizing beamsplitter 60. The total optical power is given by the sum of powers at the detectors 26-1 and 26-2, while detector 26-1 (or 26-2) and detector 26-3 constitute a pair of quadrature polarimetric channels.

Instead of measuring the total optical power at the output end of the BGO crystal, one can also monitor the total light power before the light goes into the sensing crystal. One can even rely on the internal monitor of the light source 20 to track power change or maintain a stable optical power output. However, such schemes would not be able to deal with optical loss changes in the path from the light source to the polarimetric detectors, which can be important in a practical sensor, especially if fiber optics are used to deliver light from the light source to the sensing crystal.

Figure 7A:
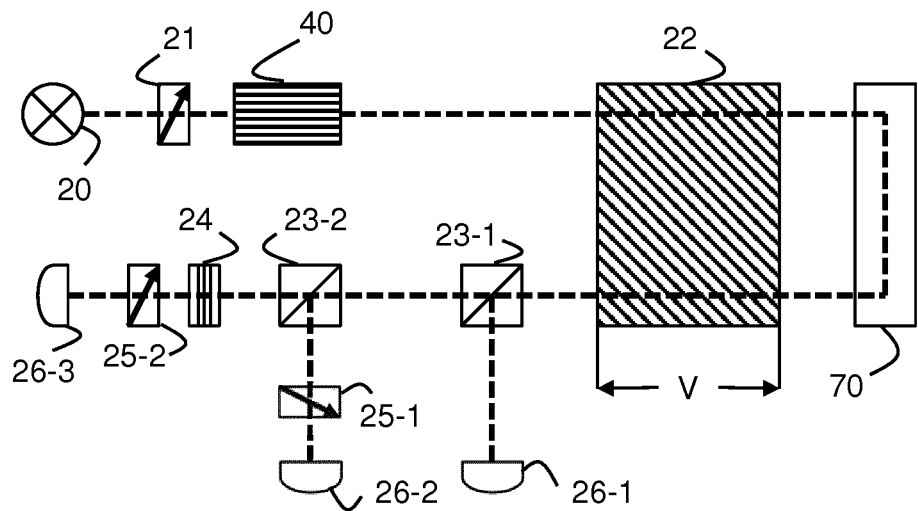
FIGS. 7A and 7B are DC voltage sensors based on a polarimetric quadrature signal detection scheme using a reflective configuration in accordance with examples of the invention.
Figure 7B:
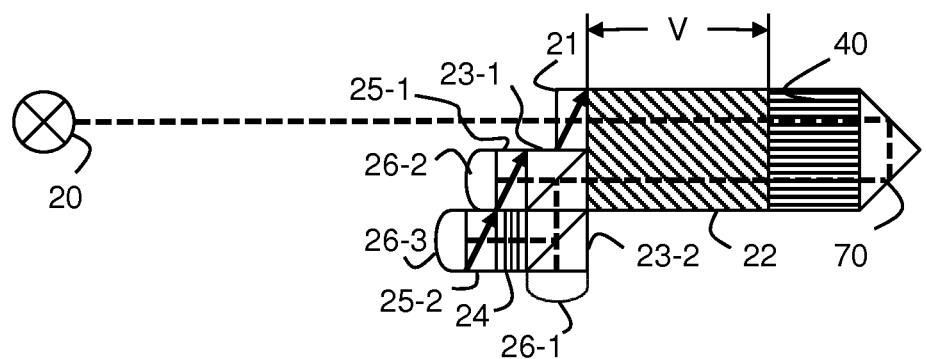

The polarimetric voltage sensors can also be designed in a reflective configuration, wherein the electro-optic phase shift as induced by the measurand would be doubled. Examples illustrating such a configuration are shown in FIGS. 7A and 7B, where a reflecting optic 70 is placed at one end of the crystal, and all the other optical elements are located at the other end. Other elements are identical or similar to those described already when referring to FIG. 5 above.

The reflecting optic 70 may be a flat/curved mirror, a roof mirror, a corner-cube retroreflector, or simply a reflective thin film coating deposited on the end face of the crystal. The reflection at the reflecting optic should ideally preserve the polarization state of the light without rotation or polarization-dependent phase shift. Any residual phase shift from reflection can also be characterized and taken out by calibration. Preferably, the light source and detector end of the crystal is connected to the ground potential, and the reflector end to the high voltage, in order to keep the light source and the detectors at the ground potential.

Figure 8:
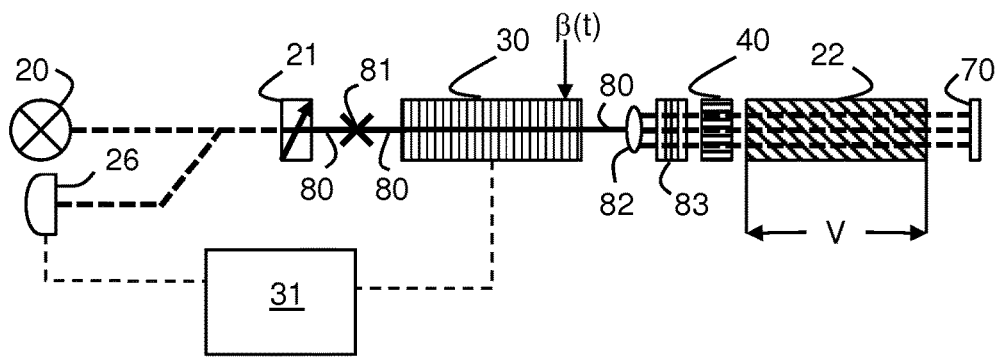
FIGS. 8 and 9 are DC voltage sensors based on a phase modulation signal detection scheme in accordance with examples of the invention.
Figure 9:
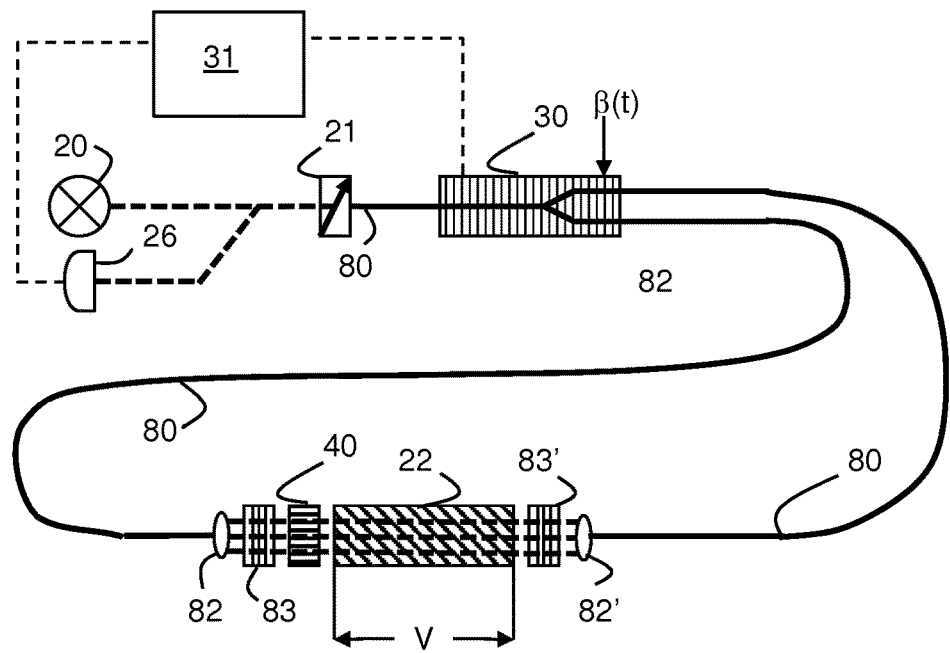

FIGS. 8 and 9 illustrate examples of an extended-range DC voltage sensor in connection with a MPD scheme. As described above (see eq. [4']), the MPD scheme is another approach to simultaneously measure the phase shift and the interference contrast. However, an MPD-based voltage sensor in the transmissive configuration, similar to the one depicted in FIG. 3, is not suited for most practical applications, because the intrinsic phase shifts in the phase modulator 30 and the connecting polarization-maintaining fibers are generally very sensitive to temperature and/or stress variations. Therefore, the output of a transmissive MPD-based voltage sensor is easily affected by environmental disturbances.

On the other hand, robust MPD sensors can be designed based on a reciprocal optical design, whereby the two interfering waves either counter-propagate in a loop (e.g. in the case of a fiber-optic gyroscope) or retrace the optical path upon reflection with swapped orthogonal polarizations (e.g. in the case of a reflective fiber-optic current sensor). In such designs, the intrinsic phase shifts of the phase modulator and the interconnecting PM fibers automatically cancel along the reciprocal path (and hence the temperature dependence thereof), while the phase modulation and the measurand-induced phase shift double. As explained already in the introduction, this is usually referred to as "non-reciprocal phase modulation."

The co-owned patent U.S. Pat. No. 7,911,196 (ref. [9]) describes a non-reciprocal phase modulation voltage sensor incorporating a voltage sensing element (or several such elements), a 45° Faraday rotator, MPD modulation and detection electronics. The sensor in that patent is only capable of unambiguously measuring a DC electro-optic phase shift in the range of $-\pi$ to $+\pi$ because of the period wise ambiguity problem of the phase shift. However, as is shown above, the MPD signal processing scheme can be extended to yield also the interference contrast $A(\tau(x))$, in addition to the phase shift. Therefore, with a low-coherence light source, the sensors described for example in U.S. Pat. No. 7,911,196 can be used to unambiguously measure a DC voltage in an extended range, employing the contrast-based disambiguation methods and apparatus as described herein.

All embodiments in U.S. Pat. No. 7,911,196 can benefit from this invention. To demonstrate how the inventions in the patent can be extended beyond the $2\pi$ measurement range, a suitable adaptation to an example described in U.S. Pat. No. 7,911,196 is shown in FIG. 8 using elements already described when referring to FIG. 3 above. Here, a low-coherence light source 20 and a photodetector 26 are connected via a 1×2 fiber-optic coupler to the sensing element 22. The light first passes through a linear polarizer 21, enters into a polarization maintaining (PM) fiber 80, and is coupled into both axes of a fiber-optic birefringent phase modulator 30 through a 45° splice 81. The light is then coupled out of a collimator 82, passes through a 45° Faraday rotator 83, a group delay bias element 40, and enters the sensing element 22 (BGO crystal along the [001] axis), the ends of which are electrically connected to the voltage supply V. The crystal end faces can be coated with a transparent conductive electrode layer. The light is reflected back into the sensing medium, the group delay bias element, the Faraday rotator and the PM fiber in sequence, by a reflecting optic 70 at the far end of the sensing medium 22. The reflecting optic may be a flat/curved mirror, a roof mirror, a corner-cube retroreflector, or simply a reflective thin film coating deposited on the end face of the crystal. In this example the reflection at the reflecting optic should preserve the polarization state of the light without rotation or polarization-dependent phase shift.

A birefringent crystal acting as static group-delay bias element 40 (such as a crystalline quartz wave-plate) is inserted between the Faraday rotator 83 and the reflecting optic 70, in order to adjust the group-delay bias, as discussed when referring to FIG. 1B above. The optical axes of the BGO crystal and the birefringent crystal are to be aligned at 45° relative to the axes of the PM fiber leading to the collimator 82.

Due to the two-time 45° Faraday rotation in the reciprocal path, the interfering orthogonally polarized waves swap their polarizations as they reenter the PM fiber and the birefringent phase modulator 30, thereby canceling the associated intrinsic phase shifts and eliminating the temperature dependence thereof. The 45° splice 81 and the polarizer 21 on the return path allows the coherent mixing of the polarization waves, and the photodetector 26 measures the resulting light power.

A signal processing and control unit 31 controls the phase modulation waveform and measures the light power at the photodetector. It calculates the phase shift principal value and the interference contrast, for example according to the procedure described in eq. [4']. Finally, the phase shift principal value and the interference contrast are combined to yield an unambiguous measurement of the voltage.

Any residual system phase shifts, for example from the beamsplitter or the reflecting optic or from the residual natural birefringence of the BGO crystal, can be characterized and taken out by calibration.

A loop configuration where the reflecting optic 70 of FIG. 8 is replaced with a Y-type phase modulator 30 and another set of collimator 82' and Faraday rotator 83', is shown in FIG. 9. Due to the Faraday rotators 83 and 83', the waves are polarized along orthogonal electro-optic axes of the sensing medium 22 in the two counter-propagating directions whereas they are polarized along the same axis in the PM fibers 80. An advantage over the reflective configuration of FIG. 8 is that there are more degrees of freedom in the alignment of the optical components, which may simplify the light coupling from electro-optic crystal back into the PM fiber 80. A possible drawback of the design of FIG. 9 is the larger number of components.

While some preferred embodiments of the invention are shown and described above, it is to be understood that the invention is not limited thereto but may be otherwise variously embodied and practiced within the scope of the following claims.

While the examples above describe sensors based on optical interferometry, it should be appreciated that this invention can be applied to all types of interferometers. For example, an interferometer in the RF or other electromagnetic radiation bands can also benefit from the same unambiguous extension of the measurement range. The invention is also not limited to electro-magnetic waves. Any interferometer involving waves, be it acoustic, density, or other types of waves, can also benefit in the same way.

The low-coherence source can either be a light source of broad bandwidth, or a synthesized source made up from multiple sources at different wavelengths. The shape of its spectrum is not important. The inverse of the overall frequency bandwidth should be on the same order of the group delay span corresponding to the width of the desired unambiguous measurement range of the sensor.

Whilst designs of a DC voltage sensor are described as examples, this invention can also be easily applied to a fiber optic current sensor, a fiber gyroscope, or other type of interferometric sensors. However, it is in particular advantageous for any DC interferometric sensors covering a large range where an absolute zero reference is not available.

REFERENCES CITED

[1] G. A. Massey, D. C. Erickson, and R. A. Kadlec, "Electromagnetic field components: their measurement using linear electrooptic and magnetooptic effects," Appl. Opt., vol. 14, pp. 2712-2719, 1975.

[2] K. Bohnert and J. Nehring, "Method and device for the optical determination of a physical quantity," U.S. Pat. No. 5,715,058, 1998.

[3] R. C. Miller, "Electro-optical voltage measuring system incorporating a method and apparatus to derive the measured voltage waveform from two phase shifted electrical signals," U.S. Pat. No. 4,904,931, 1990.

[4] R. C. Miller, "Method of deriving an AC waveform from two phase shifted electrical signals," U.S. Pat. No. 5,001,419, 1991.

[5] K. Kurosawa, S. Yoshida, E. Mori, G. Takahashi, and S. Saito, "Development of an optical instrument transformer for DC voltage measurement," Power Delivery, IEEE Transactions on, vol. 8, pp. 1721-1726, 1993.

[6] H. Lefèvre, The Fiber-Optic Gyroscope: Artech House, 1993.

[7] K. Bohnert, P. Gabus, J. Nehring, and H. Brändle, "Temperature and vibration insensitive fiber-optic current sensor," Journal of Lightwave Technology, vol. 20, pp. 267-276, 2002.

[8] K. Bohnert, P. Gabus, J. Nehring, H. Brändle, and M. G. Brunzel, "Fiber-Optic Current Sensor for Electrowinning of Metals," J. Lightwave Technol., vol. 25, pp. 3602-3609, 2007.

[9] K. Bohnert, "Optical voltage sensor," U.S. Pat. No. 7,911,196B2, 2011.

[10] C. Zhang, X. Feng, S. Liang, and C. Li, "Quasi-reciprocal reflective optical voltage sensor based on Pockels effect with digital closed-loop detection technique," Optics Communications, vol. 283, pp. 3878-3883, 2010.

[11] O. Beierl, T. Bosselmann, and M. Willsch, "Method and arrangement for optically detecting an electrical variable," WO9805975A1, 1998.

[12] M. Stanimirov, U. Meier, K. Bohnert, and J. Glock, "Method of measuring a voltage and voltage sensor," EP1179735A1, 2002.

[13] J. Brooks, R. Wentworth, R. Youngquist, M. Tur, K. Byoung-Yoon, and H. J. Shaw, "Coherence multiplexing of fiber-optic interferometric sensors," Lightwave Technology, Journal of, vol. 3, pp. 1062-1072, 1985.

[14] S. A. Al-Chalabi, B. Culshaw, and D. E. N. Davies, "Partially Coherent Sources in Interferometric Sensors," in 1st International Conference on Optical Fibre Sensors, London, England, 1983, pp. 132-135.

[15] T. Bosselmann and R. Ulrich, "High-Accuracy Position-Sensing With Fiber-Coupled White-Light Interferometers," in 2nd International Conference on Optical Fiber Sensors, Stuttgart, Germany, 1984, pp. 361-364.

[16] R. Ulrich, "Method for the measurement of lengths and displacements," U.S. Pat. No. 4,596,466, 1986.

[17] G. Beheim, K. Fritsch, and R. N. Poorman, "Fiber-linked interferometric pressure sensor," Review of Scientific Instruments, vol. 58, pp. 1655-1659, 1987.

[18] G. Beheim, "Fibre-Optic Thermometer Using Semiconductor-Etalon Sensor," Electronics Letters, vol. 22, pp. 238-239, 1986.

[19] F. Farahi, T. P. Newson, J. D. C. Jones, and D. A. Jackson, "Coherence multiplexing of remote fibre optic Fabry-Perot sensing system," Optics Communications, vol. 65, pp. 319-321, 1988.

[20] A. Koch and R. Ulrich, "Displacement sensor with electronically scanned white-light interferometer," in Fiber Optic Sensors IV, 1990, pp. 126-133.

[21] R. C. Youngquist, S. Carr, and D. E. N. Davies, "Optical coherence-domain reflectometry: a new optical evaluation technique," Opt. Lett., vol. 12, pp. 158-160, 1987.

[22] K. Takada, I. Yokohama, K. Chida, and J. Noda, "New measurement system for fault location in optical waveguide devices based on an interferometric technique," Appl. Opt., vol. 26, pp. 1603-1606, 1987.

[23] P. J. Caber, "Interferometric profiler for rough surfaces," Appl. Opt., vol. 32, pp. 3438-3441, 1993.

[24] D. Huang, E. Swanson, C. Lin, J. Schuman, W. Stinson, W. Chang, M. Hee, T. Flotte, K. Gregory, C. Puliafito, and a. et, "Optical coherence tomography," Science, vol. 254, pp. 1178-1181, Nov. 22, 1991 1991.

[25] A. F. Fercher, C. K. Hitzenberger, G. Kamp, and S. Y. El-Zaiat, "Measurement of intraocular distances by backscattering spectral interferometry," Optics Communications, vol. 117, pp. 43-48, 1995.

[26] R. Jones, R. J. Welford, and M. S. Hazell, "Interferometer having a short coherence length light source and means for identifying interference fringes," U.S. Pat. No. 5,301,010, 1994.

[27] S. M. Bennett and R. B. Dyott, "DSP Signal Processing for Open Loop Fiber Optic Sensors," U.S. Pat. No. 6,429,939B1, 2002.

LIST OF REFERENCE SIGNS normalised detector signal 11
interference contrast 12
principal value of the phase shift 13
area of strongly varying interference contrast 14
wave or light source 20
input polarizer 21
sensing element 22
beamsplitter 23-1, 23-2
quarter wave retarder (QWR) 24
output polarizer 25, 25-1, 25-2
wave or optical detector 41,26, 26-1, 26-2,26-3
phase modulator 30
signal processing unit 31
phase shift detector 31-1
contrast detector 31-2
group delay shifting element 40
polarizing beamsplitter 65
reflecting optic 70
polarization maintaining (PM) fiber 80
45° splice 81
collimator 82,82'
Faraday rotator 83,83'

The invention claimed is:

1. An interferometric sensor comprising a sensing element whereby a measurand induces a relative phase shift between two waves passing through the sensing element, wherein the sensing element is a voltage sensor and the measurand is an electric voltage or an electric field strength and the relative phase shift inside the sensing element is responsive to a voltage applied between two faces of the sensing element, at least one detector measuring an interference signal between the two waves, and further comprising a phase shift detection unit having as input the interference signal and determining a first measure representative of a principal value ($\varphi$) of the relative phase shift and a contrast detection unit having as input the interference signal for determining a second measure (A) representative of a cross-correlation between the two waves, and further a signal processing unit for converting the first and second measures to a measurand value, wherein the second measure is a parameter relating to an interference contrast or fringe visibility, wherein the two waves in interference have a sufficiently broad spectrum to produce a rapidly varying and monotonic cross-correlation function in a range of a same width as a target measurement range, and wherein using the second measure representative of the cross-correlation, the sensor removes period ambiguity from the relative phase shift as measured, and further comprising at least two interference channels with at least two detectors and at least one static optical phase bias element in at least one of the at least two interference channels, and wherein the signal processing unit combines the interference signals of the at least two interference channels to form the first measure (arg Y) and the second measure (abs Y).

2. The sensor of claim 1, wherein the signal processing unit matches the second measure to a pre-determined function or map of parameter values representing the cross-correlation function (A) between the two waves across the measurement range of the sensor.

3. The sensor of claim 1, wherein the signal processing unit uses the second measure to determine a period count n.

4. The sensor of claim 1, further including one or more sources generating two waves, the cross-correlation (A) of which varies strongly and monotonically with the relative group delay (τ) between the two waves within the measurement range of the sensor.

5. The sensor of claim 1, wherein $|A(\Phi)-A(\Phi\pm2\pi)|/A(\Phi)\geq 0.001$, with A being said second measure and (Φ) being said phase shift.

6. The sensor of claim 4, wherein the two waves are generated by the same source of the one or more sources, whereby the cross-correlation function (A) is the auto-correlation function of the wave generated by the same source.

7. The sensor of claim 4, with the one or more sources having a spectrum covering at least one of a continuous band, or a spectrum consisting of multiple disconnected bands or disconnected spectral lines.

8. The sensor of claim 1, further including a group delay bias element to shift the measurement range of the sensor into a region of monotonic variation of the cross-correlation function (A) with the relative group delay (τ) between the two waves.

9. The sensor of claim 8, wherein the group delay bias element is a birefringent material, a birefringent waveguide, a polarization-maintaining optical fiber, or a combination thereof.

10. The sensor of claim 1, wherein the measurement range of the sensor includes a region where the gradient of the cross-correlation function (A) with regard to the group delay (τ) (|dA/dτ|) has a maximum value.

11. The sensor of claim 1, wherein a phase bias difference between the interference channels is within (90°±40°)+180°×i, wherein i is an integer including zero.

12. The sensor of claim 1, further comprising an additional signal channel with a detector measuring a quantity representative of the total power of the waves before interference, or at least one additional channel in antiphase with any of the interference channels, and wherein the signal processing unit combines the interference channel signals and the additional channel(s) signal to compute the first and the second measures independent of total power or loss variation.

13. The sensor of claim 1, further comprising an optical phase modulation element adding a phase modulation to the relative phase shift between the two waves and at least one detector channel for measuring the interference signal, and wherein the signal processing unit analyzes the interference signal to form the first measure (arg Y) and the second measure (abs Y).

14. The sensor of claim 13, wherein the signal processing unit operates in closed-loop control with a feedback signal representative of the principal value (φ) of the relative phase shift.

15. The sensor of claim 1, wherein the two waves are light waves, wherein the light waves are one of a orthogonal linearly polarized light waves or left and right circularly polarized light waves.

16. The sensor of claim 15, wherein the sensing element comprises a bulk electro-optic crystal, or an electro-optic fiber.

17. The sensor of claim 16, comprising at least one light source, at least one linear polarizer, an optical phase modulator, a Faraday rotator with a rotation angle within (45°±25°)+90°×k, k being an integer, an electro-optic sensing element, and a reflecting optic.

18. The sensor of claim 15, wherein the sensing element comprises a magneto-optic material, or an optical fiber.

19. A method of performing an interference measurement comprising the steps of:

generating at least two waves;

determining a function or a map of parameter values representative of a cross-correlation function between the at least two waves;

exposing a sensing element to a measurand which is an electric voltage or an electric field strength, and a relative phase shift inside the sensing element is responsive to a voltage applied between two faces of the sensing element and which induces a relative phase shift between the at least two waves passing through the sensing element which is a voltage sensor;

letting the at least two waves interfere, wherein the at least two waves in interference have a sufficiently broad spectrum to produce a rapidly varying and monotonic cross-correlation function in a range of a same width as a target measurement range;

combining interference signals of at least two interference channels to form a first measure and a second measure, the at least two interference channels comprising at least two detectors and at least one static optical phase bias element in at least one of the at least two interference channels;

simultaneously determining for a value of the measurand the first measure representative of a principal value (φ) of the relative phase shift and the second measure (A) representative of the cross-correlation between the at least two waves; and combining the first and second measures with a predetermined function or map of parameter values representative of a cross-correlation function and determining a corresponding measurand value, wherein the second measure representative of the cross-correlation function (A) between the at least two waves is a parameter relating to an interference contrast or fringe visibility and wherein using the second measure representative of the cross-correlation, the voltage sensor removes period ambiguity from the relative phase shift as measured.

20. The method of claim 19, wherein the function or the map of parameter values representative of the cross-correlation function is used to convert the second measure to a period counter n.

* * * * *